United States Patent

Kudo et al.

[11] Patent Number: 5,973,381
[45] Date of Patent: *Oct. 26, 1999

[54] MOS CAPACITOR AND MOS CAPACITOR FABRICATION METHOD

[75] Inventors: Chiaki Kudo; Akihiro Yamamoto, both of Kyoto, Japan

[73] Assignee: Matsushita Electronics Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/508,182

[22] Filed: Jul. 27, 1995

[30] Foreign Application Priority Data

Jul. 27, 1994 [JP] Japan .................................. 6-175473

[51] Int. Cl.⁶ .................................................. H01L 29/00
[52] U.S. Cl. .......................... 257/532; 257/296; 257/300
[58] Field of Search .................................. 257/532, 296, 257/300

[56] References Cited

U.S. PATENT DOCUMENTS

| | | | |
|---|---|---|---|
| 4,183,040 | 1/1980 | Rideout | 257/300 |
| 4,355,374 | 10/1982 | Sakai et al. | 257/306 |
| 4,543,594 | 9/1985 | Mohsen et al. | 257/296 |
| 4,746,377 | 5/1988 | Kobayashi et al. | 257/296 |
| 4,762,802 | 8/1988 | Parrillo | 257/371 |
| 4,877,751 | 10/1989 | Teng et al. | |
| 4,898,839 | 2/1990 | Fujinuma et al. | 257/532 |
| 5,093,702 | 3/1992 | Kim | 257/532 |

FOREIGN PATENT DOCUMENTS

| | | | |
|---|---|---|---|
| 61-272963 | 12/1986 | Japan . | |
| 1-205561 | 8/1989 | Japan | 257/532 |
| 2-192153 | 7/1990 | Japan | 257/532 |

OTHER PUBLICATIONS

USPTO Full English Translation of Japan Kokai 57–45269 (Mar. 1982) to Satou et al.

*Primary Examiner*—J. Carroll
*Attorney, Agent, or Firm*—McDermott, Will & Emery

[57] ABSTRACT

A MOS capacitor has a p-type silicon substrate, an n-type impurity diffusion area formed by implanting an impurity into a region of the silicon substrate, a silicon oxide layer formed on the diffusion area, and a polysilicon electrode formed on the silicon oxide layer. An impurity profile is formed in the region such that the concentration of the impurity increases from a surface common to the diffusion area and the silicon oxide layer towards the inside of the silicon substrate. The concentration of the impurity at the interface is less than or equal to $1 \times 10^{20} \text{cm}^{-3}$, and a peak concentration lies at a depth of more than 0.05 $\mu$m under the interface. This controls accelerated oxidization during the thermal oxidization and also controls the dependence of the capacitance on the voltage.

8 Claims, 12 Drawing Sheets

MOS CAPACITOR AND MOS CAPACITOR FABRICATION METHOD

BACKGROUND OF THE INVENTION

This invention generally relates to a metal-oxide-semiconductor (MOS) capacitor which is, together with a MOS transistor, formed on a semiconductor substrate and to an associated MOS capacitor fabrication method. More particularly, the present invention pertains to a space-saving MOS capacitor.

Small, portable information/communication devices have been developed and commercialized and many of them deal with both digital signals and analog signals. Usually, digital signals and analog signals are processed by separate semiconductor devices because processing of analog signals requires a high-performance capacitor. In circuits which have MOS transistors and which deal with digital signals, a MOS capacitor structure is employed. A MOS capacitor, however, has the disadvantage that its capacitance depends much on the applied voltage. If a MOS capacitor is used to form a part of an analog circuit, this results in causing signals to be distorted badly and, hence, practical applications of the MOS capacitor become difficult.

Japanese Patent Application, published under Pub. No. 61-272963, shows a MOS capacitor. The fabrication of this MOS capacitor is explained. A selected region of a semiconductor substrate is lightly-doped with an impurity, to form a diffusion area of low concentration. Thereafter, the semiconductor substrate is placed in a vacuum at a temperature of 1100 degrees centigrade for about 40 seconds, whereupon implanted impurity atoms present in the vicinity of the surface of the lightly-doped diffusion area are diffused outwardly. As a result, a region of lower concentration in comparison with the lightly-doped diffusion area comes to exist extending from the surface up to a predetermined depth. Subsequently, a thermal oxide layer is formed. A polysilicon layer is formed on the thermal oxide layer. In this way, a MOS capacitor, composed of the polysilicon layer that acts as a top electrode, the lightly-doped diffusion area that acts as a bottom electrode, and the oxide layer that acts as a capacitance section, is fabricated. In accordance with this technique, a region of very low concentration, which extends from the surface of a lightly-doped diffusion area to a predetermined depth, is formed, with a view to holding MOS capacitor leakage current as low as possible.

U.S. Pat. No. 4,877,751 shows a MOS capacitor. This MOS capacitor has an impurity profile such that the impurity concentration at an impurity diffusion area of a semiconductor substrate that acts as a top or bottom electrode for a MOS capacitor, continuously decreases from a surface common to the impurity diffusion area and an oxide layer towards the inside of the semiconductor substrate. In the fabrication of this MOS capacitor, a selected region of a semiconductor substrate is heavily-doped with an impurity, to form a diffusion area having a high concentration of about $10 \times 10^{20}$ or more. A thermal oxide layer is formed on the heavily-doped diffusion area. Thereafter, a polysilicon electrode is formed on the thermal oxide layer.

When forming a MOS capacitor that depends less on the applied voltage and a MOS transistor on a semiconductor substrate at the same time, a 2-level polysilicon process has been used. In this 2-level polysilicon process, an oxide layer is placed between two polysilicon layers. Alternatively, a monolevel polysilicon process may be used. In the monolevel polysilicon process, a first oxide layer is placed between a polysilicon layer and a first-level metallization layer and a second oxide layer is placed between the first-level metallization layer and a second-level metallization layer.

In the 2-level polysilicon process, an interlayer film, e.g., a silicon oxide layer, is formed between first- and second-level polysilicon layers, to act as a capacitance section. Although such an interlayer film of silicon oxide may be formed at a step of forming a gate oxide layer for a MOS transistor by thermal-oxidizing a semiconductor substrate, the film thickness of the interlayer film becomes about three to four times the film thickness of the gate oxide layer, because the semiconductor substrate and the heavily-doped polysilicon layer have different oxidation rates.

In the monolevel polysilicon process, a step of forming a polysilicon layer acting as a gate for a MOS transistor, first- and second-level metallization layers, and first and second interlayer dielectric films is utilized. As a result, the first interlayer dielectric film, formed between the polysilicon layer and the first-level metallization layer, has a film thickness of hundreds of nanometers, and the second interlayer dielectric film, formed between the first- and second-level metallization layers, has a film thickness of hundreds of nanometers. The film thickness of the oxide layers (i.e., the capacitance oxide layers) is that thick, which means that a capacitor, made in accordance with a monolevel polysilicon process, is about 50–100 times as large as a capacitor made in accordance with a 2-level polysilicon process.

The 2-level polysilicon process has advantages and disadvantages. While the dependence of the capacitance on the applied voltage is reduced, the number of masks, the number of fabrication steps, the period of processing, and the cost of production all increase in comparison with a conventional monolevel polysilicon process. Additionally, an oxide layer is formed on a polysilicon layer, having a greater film thickness in comparison with a thermal oxide layer grown on a silicon substrate. This is space-consuming and leads to poor capacitor reliability.

Likewise, the monolevel polysilicon process has its advantages and disadvantages. This process achieves a capacitor capable of depending less on the applied voltage; however, it presents the problem that, since an interlayer film of a MOS transistor is used also as a capacitance oxide, the film thickness of the capacitance oxide inevitably increases. This is space-consuming, and larger capacitance requires larger area.

Japanese Patent Application, published under Pub. No. 61-272693, shows a MOS capacitor structure. In accordance with this structure, a diffusion region is formed by a low-dose implantation and a second diffusion region is formed on the first diffusion by a lower-dose implantation. This MOS capacitor structure, however, may present the following drawbacks.

For example, suppose a case where a region is lightly implanted with an n-type impurity to form a lightly-doped diffusion area. In this case, if a voltage applied to a polysilicon electrode is a positive bias, then the polysilicon electrode stores positive electric charges while on the other hand the lightly-doped diffusion area stores negative electric charges. Because of such a light doping, the stored electric charges are not allowed to exist locally on the surface of a semiconductor substrate and space electric charges result. The distribution depth of such space electric charge changes with the applied voltage value, which increases the applied voltage dependence.

On the other hand, if a voltage applied is a negative bias, then the polysilicon electrode stores negative electric charges while the lightly-doped diffusion area stores positive electric charges. As a result, a depletion layer whose depth varies with the applied voltage spreads in the lightly-doped diffusion area. The combined capacitance, C, of the capacitance of the depletion layer, Csc, and the capacitance of the gate insulating layer, Ci, Csc and Ci being in in-series relationship, is given by: C=1/{(1/Ci)+(1/Csc)}. Because the spread of the depletion layer varies with the applied voltage, Csc is voltage-dependent. Additionally, as the depletion layer spreads, the degree of the dependence of Csc upon the applied voltage increases. As a result, the dependence of C upon the applied voltage increases. The capacitance value itself becomes lower. Further, because of the above-described MOS capacitor structure, the spread range of the depletion layer becomes wider.

It is difficult for this prior art MOS capacitor to reduce the dependence of the capacitance upon the applied voltage.

In accordance with the above-noted U.S. Pat. No. 4,877,751, the impurity concentration at an impurity diffusion area surface is about $1 \times 10^{20} \text{cm}^{-3}$, to prevent a depletion layer from widening. Such arrangement makes it possible to reduce the dependence of the capacitance upon the applied voltage. However, a too-high impurity concentration at the diffusion area/dielectric layer interface produces some problems. When a gate oxide layer is simultaneously formed with a dielectric layer for a MOS capacitor by thermal-oxidizing a silicon substrate surface, accelerated oxidization of silicon occurs and the resulting oxide layer becomes thick. For example, FIG. 4 of U.S. Pat. No. 4,877,751 shows an oxide layer having a film thickness of 400–500 nm. Such an oxide layer, which has undergone accelerated oxidization, is thick, in other words, the capacitance per unit area becomes poor, resulting in an increase in the MOS capacitor area. Further, voids are generated in such an oxide layer, which may increase the amount of leakage current therefore decreasing the reliability of gate oxide layers.

As described above, it is hard for the prior art techniques to provide a highly reliable MOS capacitor while at the same time reducing the size of chips. Therefore, the 2-level polysilicon process, which is an expensive process, has been used when mounting MOS capacitors on LSIs.

SUMMARY OF THE INVENTION

Bearing in mind the above-noted problems with the prior art techniques, the present invention was made. Therefore, a general object of this invention is to provide an improved MOS capacitor which is reliable, which is less dependent on the applied voltage, and which has a capacitance insulating layer with high capacitance per unit area, by making use of an inexpensive monolevel polysilicon process.

The present invention discloses a MOS capacitor. This MOS capacitor comprises:

(a) a semiconductor substrate;

(b) a diffusion area formed by implanting an impurity of high concentration into a region of said semiconductor substrate;

(c) an insulating layer formed on said diffusion area; and (d) a conducting layer formed on said insulating layer;

wherein an impurity profile is formed in said diffusion area such that the concentration of said impurity increases from a surface common to said diffusion area and said insulating layer towards the inside of said semiconductor substrate.

An impurity of high concentration is implanted into an impurity diffusion region that acts as a bottom electrode for a MOS capacitor. Such arrangement controls the spreading of space electric charge even when a positive bias is applied to a conducting layer that acts as a top electrode. Further, such arrangement controls the spreading of space electric charge even when a reverse bias is applied to a conducting layer, that is, to a top electrode. The present invention accomplishes a MOS capacitor capable of depending less on the voltage, capable of requiring a less area, and capable of being most reliable. The present invention cuts down the cost of manufacturing MOS capacitors and reduces the cost of chips.

In the above-described MOS capacitor, a MOS transistor may be formed in the semiconductor substrate.

In the above-described MOS capacitor, it is preferable that the impurity concentration increases at least up to a depth of 0.05 μm or more from the interface.

Accordingly, the dependence of MOS capacitors upon the applied voltage can be reduced.

In the above-described MOS capacitor, it is preferable that the impurity is phosphorus.

Since the phosphorus atoms have a great diffusion coefficient, this makes it easy to form a desired impurity concentration profile. Forming a MOS capacitor which depends less upon the applied voltage becomes easy.

In the above-described MOS capacitor, it is preferable that the conducting layer is formed of polysilicon.

Accordingly, a space-saving, high-quality MOS capacitor can be fabricated using an inexpensive monolevel polysilicon process. This cuts down the production cost.

In the above-described MOS capacitor, it is preferable that the film thickness of the insulating layer is less than or equal to a thickness capable of exhibiting the same capacitance per unit area that a 20 nm-thick silicon oxide layer does.

Such arrangement increases the MOS capacitor capacitance per unit area and provides a space-saving MOS capacitor.

In the above-described MOS capacitor, it is preferable that a region of the insulating layer in contact with the semiconductor substrate is formed of silicon oxide.

Accordingly, an insulating layer which has good electrical characteristics and which is adaptable to the semiconductor substrate can be formed.

In the above-described MOS capacitor, it is preferable that the concentration of the impurity at the interface is less than or equal to $1 \times 10^{20} \text{cm}^{-3}$.

As a result of such arrangement, even when an insulating layer is formed on a semiconductor substrate by means of a thermal oxidization process, increase in the film thickness due to accelerated oxidization and degradation in the characteristic can be controlled.

This invention provides a first method of fabricating a MOS capacitor. The first method comprises the steps of:

(a) implanting an impurity into a region of a semiconductor substrate having a principal surface, said impurity having a peak concentration below said principal surface;

(b) forming an insulating layer at least on said region;

(c) forming a conducting layer on said insulating layer; and (d) applying heat to increase the concentration of said impurity at a surface common to said region and said insulating layer and to cause the concentration of said impurity to increase from said interface towards the inside of said semiconductor substrate.

As a result of such arrangement, the impurity concentration at the semiconductor substrate surface prior to an oxide layer (i.e., an insulating layer) being formed can be held low. Therefore, accelerated oxidization becomes controllable even when an insulating layer is formed by means of a thermal oxidization process. On the other hand, at the time when a MOS capacitor is completed, the impurity concentration at the diffusion area/insulating layer interface can be increased. This controls variation in the capacitance with respect to a voltage applied while keeping the insulating layer reliability at high level.

The present invention provides a second method of fabricating a MOS capacitor. The second method comprises the steps of:

(a) forming on a semiconductor substrate an insulating layer;

(b) implanting an impurity into a region of said semiconductor substrate through said insulating layer, said impurity having a peak concentration below a surface common to said region and said insulating layer; and (c) applying heat to increase the concentration of said impurity at said interface and to cause the concentration of said impurity to increase from said interface towards the inside of said semiconductor substrate.

As a result of such arrangement, the impurity concentration at the semiconductor substrate surface can be set after an insulating layer is formed.

In the second method, it is preferable that the impurity implant step uses phosphorus.

Since phosphorus ions having a great diffusion coefficient are used as a dopant, this facilitates a way of determining the amount of impurity to be implanted. Phosphorus produces less damage to oxide layers and, hence, a highly reliable insulating layer can be formed.

In each of the first and second methods, it is preferable that the impurity implant step uses ions of phosphorus and is performed at an implantation energy of 70 keV or more.

In each of the first and second methods, it is preferable that the impurity implant step uses ions of arsenic and is performed at an implantation energy of 140 keV or more.

Accordingly, an impurity is implanted into a semiconductor substrate such that a peak concentration lies at a depth of 0.05 μm under the semiconductor substrate surface. This facilitates formation of a MOS capacitor having such an impurity profile that the impurity concentration increases from the insulating layer/semiconductor substrate interface towards the inside of the semiconductor substrate.

In the first method, it is preferable that the impurity concentration at the principal surface of the substrate just prior to the insulating layer formation step is $1 \times 10^{19} \text{cm}^{-3}$ or less.

Increase in the film thickness due to accelerated oxidization and degradation in the characteristic can be controlled.

DETAILED DESCRIPTION OF THE INVENTION

Preferred embodiments of this invention are now described with reference to the accompanying drawing figures.

EMBODIMENT 1

A MOS capacitor made in accordance with a first embodiment of this invention is illustrated by making reference to FIGS. 1–8.

Figure 1:
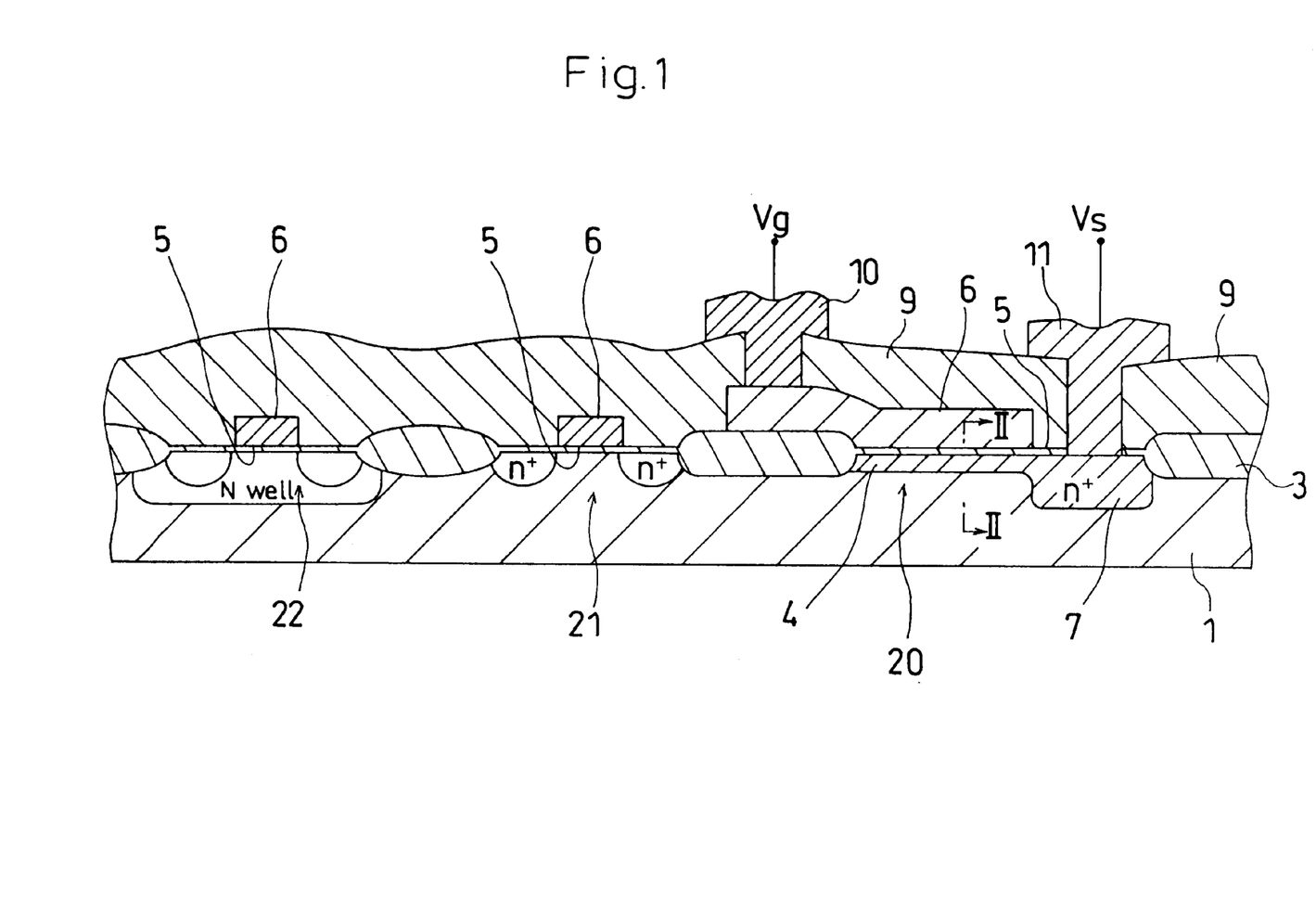
FIG. 1 depicts a cross-sectional view of a semiconductor device having a MOSFET and a MOS capacitor made in accordance with a first embodiment of the present invention.

FIG. 1 shows in cross section a MOS capacitor of the first embodiment. Mounted on silicon substrate 1 of p-type are MOS capacitor 20, NMOSFET 21, and PMOSFET 22. MOS capacitor 20, NMOSFET 21, and PMOSFET 22 each have silicon oxide layer 5 formed of thermal oxide and polysilicon electrode 6 formed of polysilicon. Each of MOS capacitor 20, NMOSFET 21 and PMOSFET 22 is electrically insulated from the other by isolator 3. Whereas polysilicon electrodes 6 of NMOSFET 21 and PMOSFET 22 act as gate electrodes, polysilicon electrode 6 of MOS capacitor 20 acts as a top electrode. Whereas silicon oxide layers 5 of NMOSFET 21 and PMOSFET 22 act as gate insulating layers, silicon oxide layer 5 of MOS capacitor 20 acts as a capacitance insulating layer. N-type diffusion area 4 is defined underneath silicon oxide layer 5 of MOS capacitor 20 by means of an implantation at a high dose of an n-type impurity. This n-type diffusion area 4 acts as a bottom electrode of MOS capacitor 20. Diffusion area 4 extends to n-type diffusion area 7 of contact. This diffusion area 7 is defined by means of a deep implantation at a higher dose of an n-type impurity. Deposited on polysilicon electrode 6 and isolator 3 are interlayer dielectric film 9 and metallic interconnect lines 10 and 11. Whereas interconnect line 10 is connected to polysilicon electrode 6 through a contact hole formed in interlayer dielectric film 9, interconnect line 11 is connected to diffusion area 7 through a contact hole formed in interlayer dielectric film 9.

Figure 2:
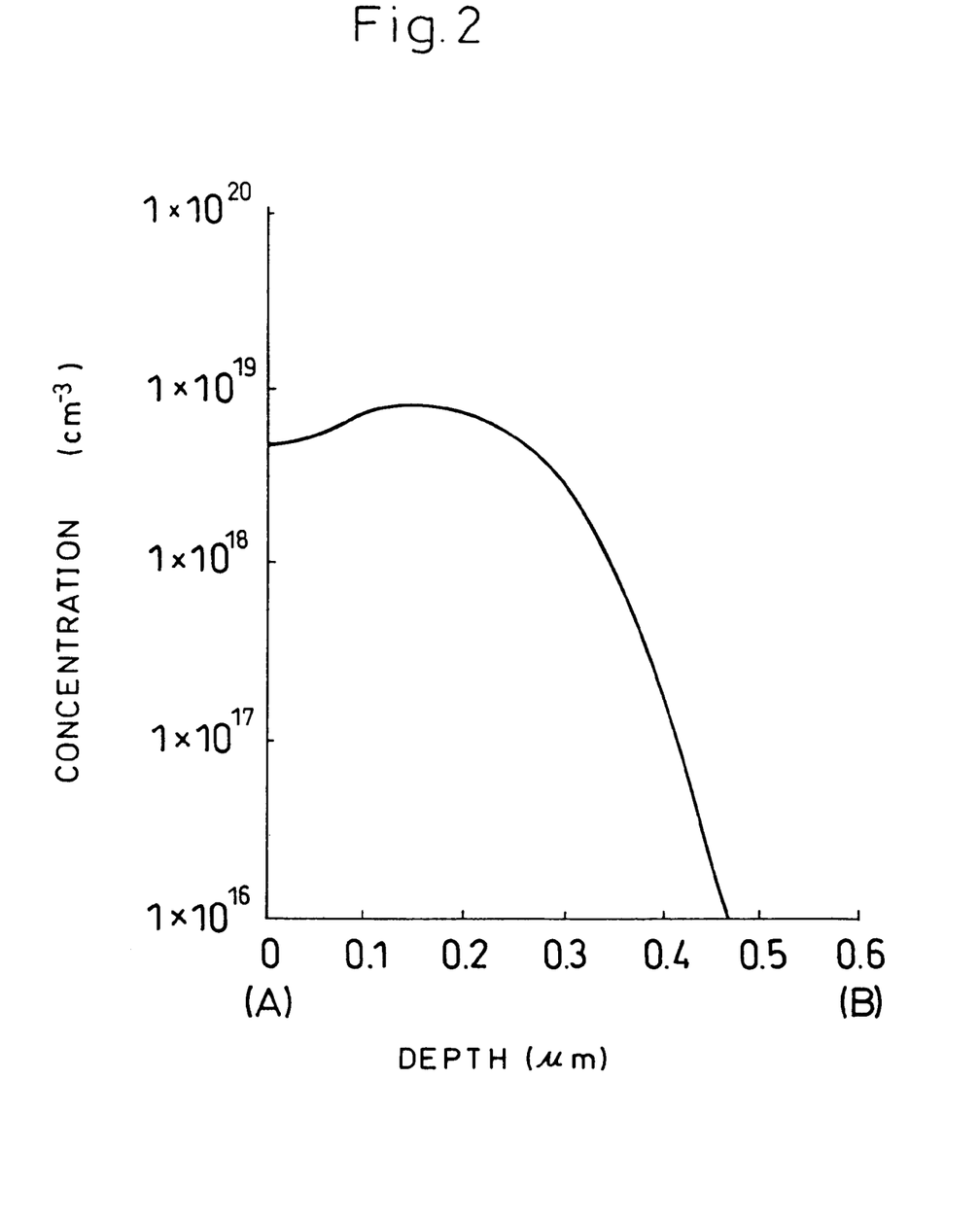
FIG. 2 is a graph showing an impurity profile at a cross section taken along lines II—II of FIG. 1.

MOS capacitor 20 of the present embodiment has the following features. FIG. 2 is a graph showing an impurity concentration profile at a cross section taken along lines II—II of diffusion area 4, the abscissa indicating the depth and the ordinate indicating the impurity concentration. As can be seen from the FIG. 2 graph, the impurity concentration at the diffusion area 4/silicon oxide layer 5 interface is approximately $5 \times 10^{18} \text{cm}^{-3}$. The impurity concentration increases with the depth and peaks at a depth of about 0.15 μm (about $1 \times 10^{19} \text{cm}^{-3}$).

Figure 4:
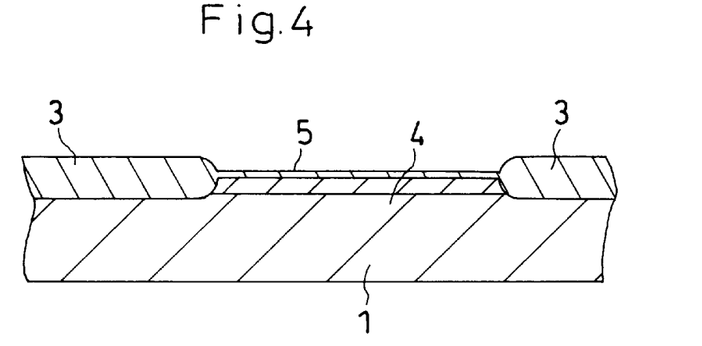

Since diffusion area 4 has an impurity concentration profile of FIG. 4 such that the impurity concentration is high at the area 4/layer 5 interface and increases therefrom towards the inside of the substrate, this gives MOS capacitor 20 the following advantages.

Figure 15:
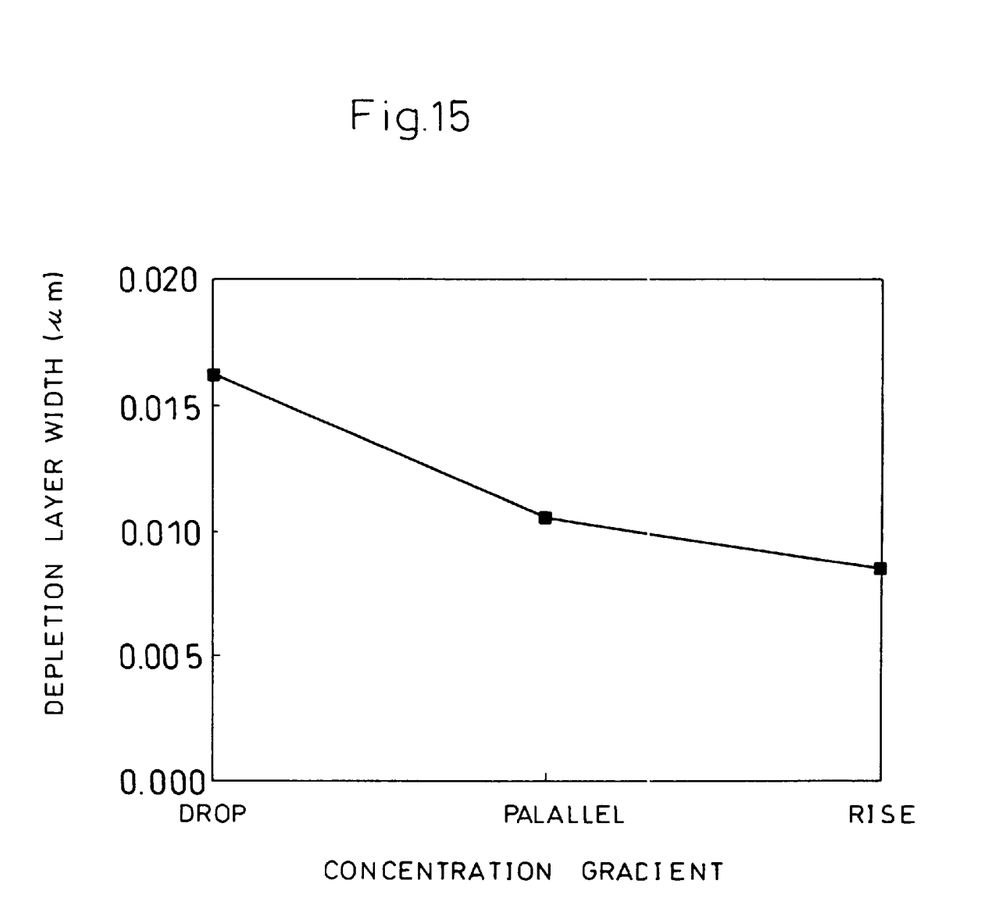
FIG. 15 is a graph showing the relationship of the impurity concentration gradient versus the depletion layer width in a MOS capacitor n-type diffusion area.

Owing to such an impurity concentration profile, the spreading of the distribution of space electric charges becomes controllable even when a positive voltage or a negative voltage is applied to polysilicon electrode 6. The reason for this is explained with the aid of FIGS. 15 and 16. The relationship of the depletion layer width versus the impurity concentration gradient, shown in FIG. 15, was simulated using a SUPREM-3, a process simulator developed by Stanford University. The simulation results were approximated to a step distribution. The interface impurity concentration is about $5 \times 10^{18} \text{cm}^{-3}$. In the FIG. 15 graph, when the impurity concentration at a depth of 0.05 μm under the interface falls by about one digit, this is DROP, and when it remains unchanged, this is PARALLEL, and when it goes up by about one digit, this is RISE. As shown in FIG. 15, the depletion layer width at DROP is greater than at PARALLEL and the depletion layer width at RISE (i.e., when the impurity concentration gradient in area 4 increases) is narrower than at PARALLEL.

As described above, when a positive bias is applied, the spreading of the distribution of space electric charges can be reduced, and when a reverse bias is applied, the spreading of depletion can be reduced. This achieves a less voltage-dependent MOS capacitor.

Figure 16:
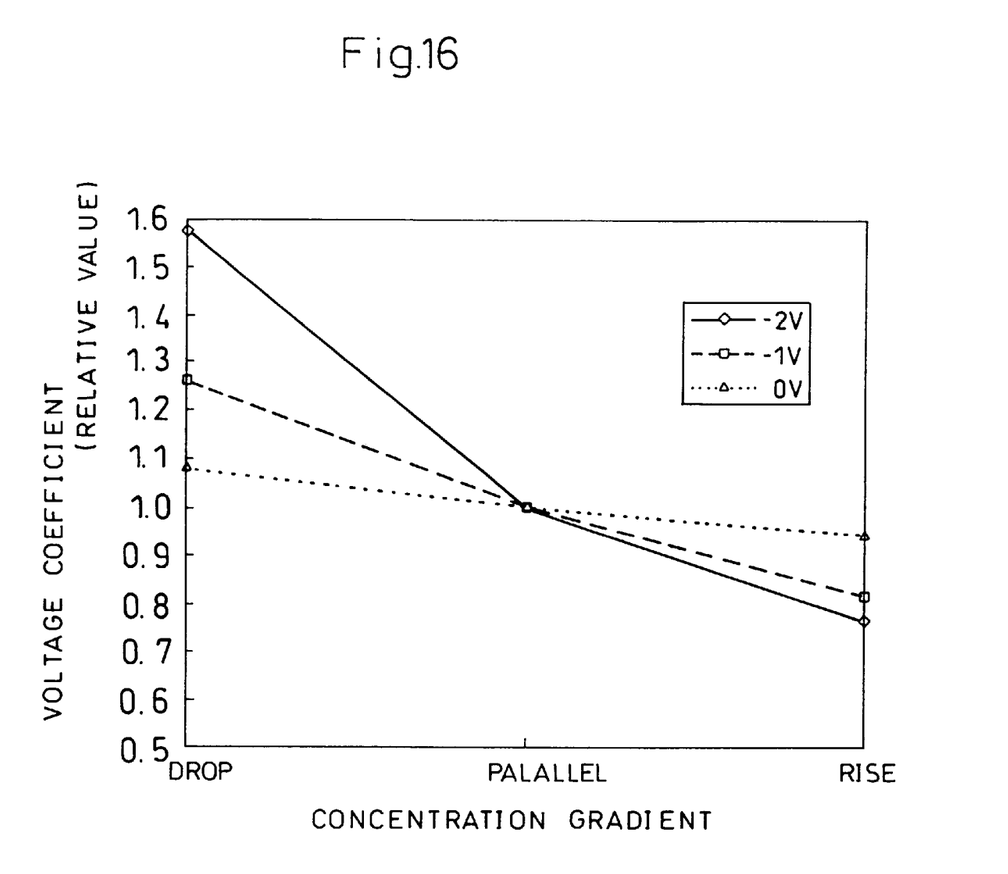
FIG. 16 is a graph showing the relationship of the impurity concentration gradient versus the voltage dependence in a MOS capacitor n-type diffusion area.

FIG. 16 is a graph showing the relationship of the impurity concentration gradient versus the capacitance voltage coefficient that takes a relative value of 1 when the impurity concentration gradient is parallel. This relationship was simulated using SEDAM-3, a ID device simulator developed by Stanford University. As illustrated in FIG. 16, when the impurity concentration gradient falls, the depletion layer width extends. As a result, the voltage coefficient, i.e., the dependence of the capacitance on the voltage, increases. Conversely, when the impurity concentration gradient goes up as in the present embodiment, this achieves a lower capacitance voltage coefficient. As a result, the dependence of the capacitance on the voltage becomes controllable.

Figure 13:
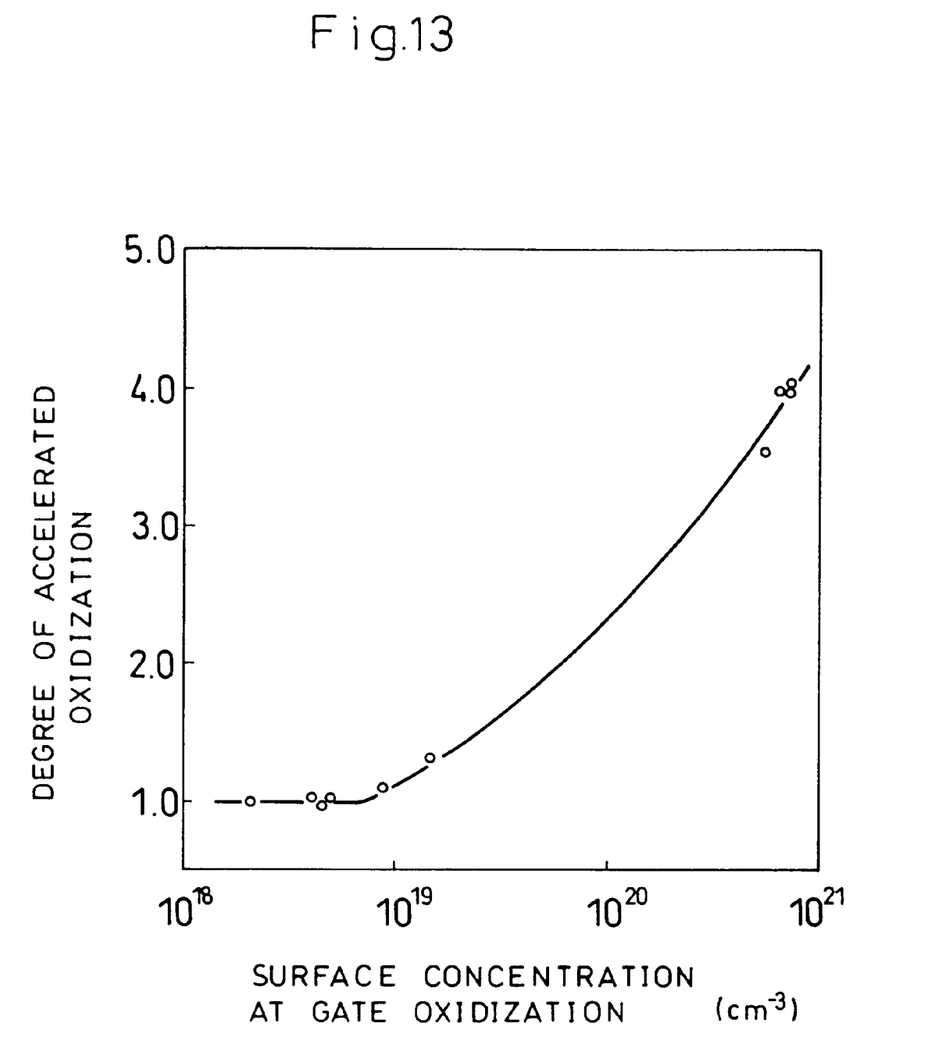
FIG. 13 is a graph in which the semiconductor surface impurity concentration versus the degree of accelerated oxidization at the time of oxidizing a gate in the first embodiment is shown.

The impurity concentration at the n-type impurity diffusion area 4/silicon oxide layer 5 interface is high but below $1 \times 10^{20} \text{cm}^{-3}$, so that the concentration can be reduced slightly at a step of the fabrication. The degree of accelerated oxidization at the time of thermal-oxidizing silicon substrate's 1 surface to form silicon oxide layer 5, can be reduced. FIG. 13 is a graph showing the relationship of the degree of accelerated oxidization versus the silicon substrate surface impurity concentration at the time of growing silicon oxide layer 5. The accelerated oxidization degree is found by dividing the film thickness of an oxide layer formed on a silicon substrate doped to a high concentration by the film thickness of an oxide layer formed on an intrinsic silicon substrate. Silicon oxide layer 5 undergoes little or no accelerated oxidization when the silicon surface impurity concentration is about $5 \times 10^{19} \text{cm}^{-3}$, as in the present embodiment. This achieves a thin, high-quality, reliable silicon oxide layer with high capacitance per unit area.

The present embodiment is able to provide inexpensive, space-saving, reliable, less voltage-dependent MOS capacitors by making use of a monolevel polysilicon process. Therefore, a MOS capacitor made in accordance with the present embodiment can be incorporated into a circuit for processing analog signals.

Figure 3:
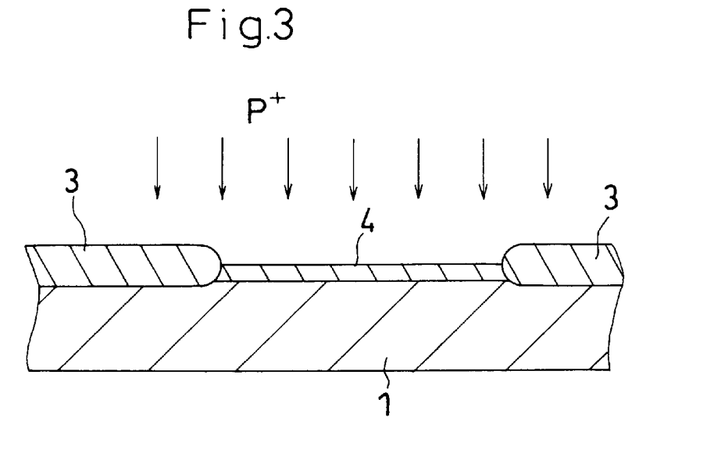
FIGS. 3–5 depict cross-sectional views of an n-type ion implantation step, a thermal oxidization step, and a metallization step of the fabrication of a MOS capacitor in accordance with the first embodiment of the present invention.
Figure 5:
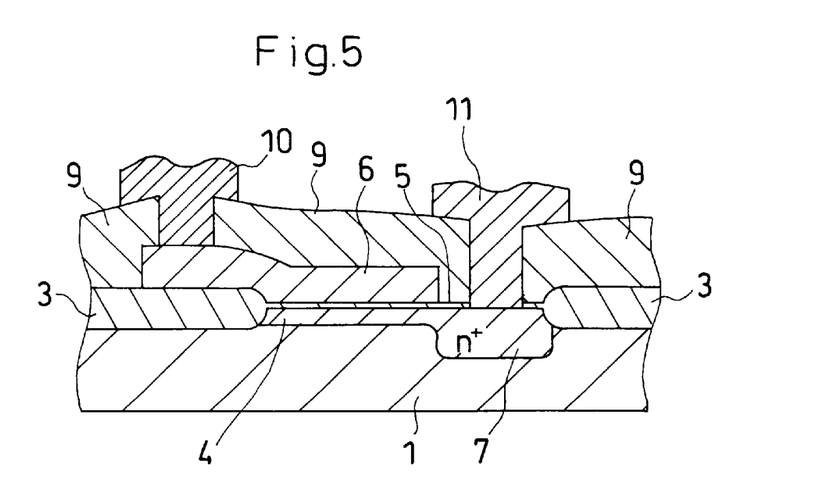
Figure 6:
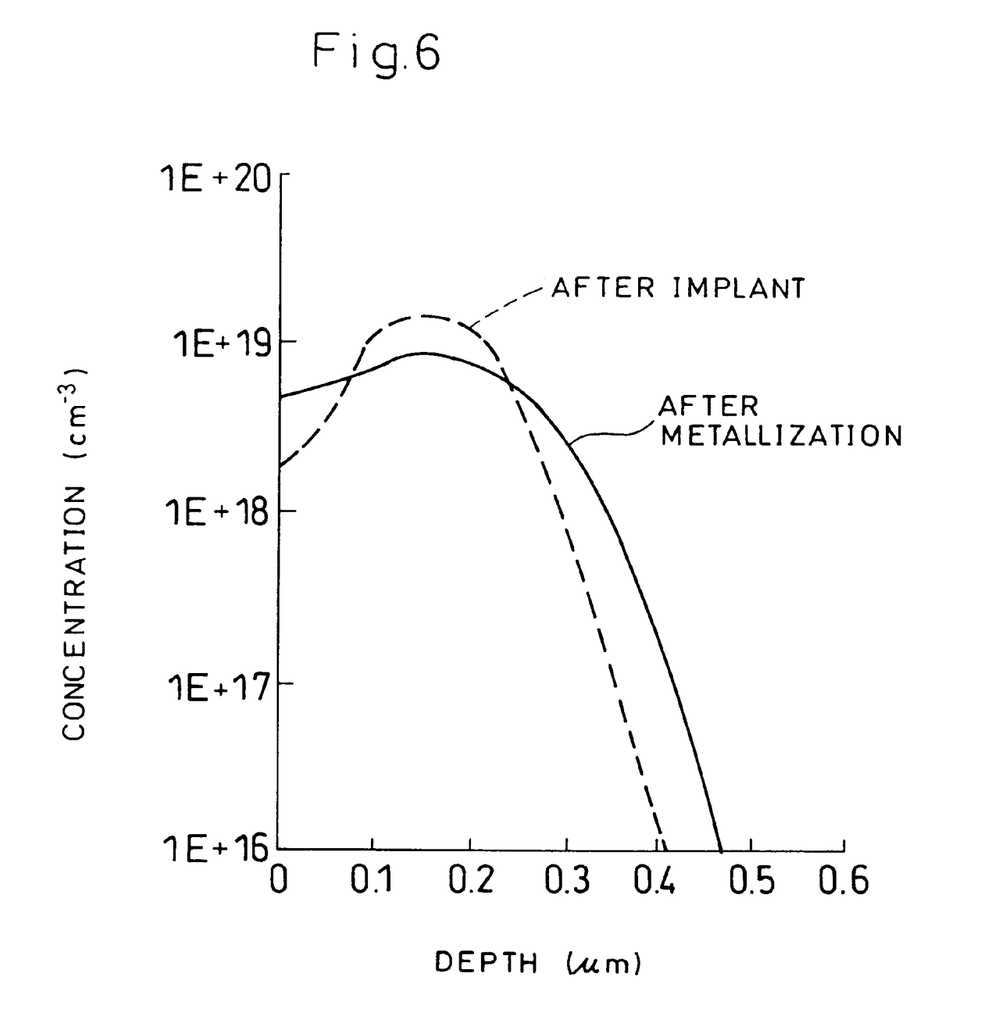
FIG. 6 is a graph showing two impurity profiles in accordance with the first embodiment, the one being formed immediately after the ion implantation and the other being formed after a MOS capacitor is formed.

Referring now to FIGS. 3–5, the fabrication of a MOS capacitor in accordance with the present embodiment is described. Here, an example of the present embodiment is described wherein a standard CMOS polysilicon process using p-type silicon substrate 1 is employed to form a MOS capacitor, and the FIG. 1 MOSFET section is not shown.

Referring to FIG. 3, isolator 3 is formed on p-type silicon substrate 1. An impurity diffusion area is defined by selectively exposing a resist. Thereafter, an impurity for controlling the threshold voltage of transistors of a depression type is implanted into the defined diffusion area, to form n-type diffusion area 4. In the present embodiment, ion implantation is carried out at an implantation energy of 120 keV at a dose of $4.5 \times 10^{14} \text{cm}^{-2}$ of phosphorus, through a thermal oxide layer having a film thickness of about 15 nm. In this case, the surface impurity concentration of silicon substrate 1 is about $2.0 \times 10^{18} \text{cm}^{-3}$. The broken line of the FIG. 6 graph shows an impurity concentration profile formed immediately after the impurity implantation.

Next, as shown in FIG. 4, a thermal oxidization process is performed to form silicon oxide layer 5. At the time of performing the thermal oxidization process, the surface impurity concentration of silicon substrate 1 is not high (see FIG. 6). Therefore, there occurs little or no accelerated oxidization (see FIG. 13). Controlling the film thickness can be achieved at a high accuracy and the reliability of oxide layers becomes high.

Thereafter, as shown in FIG. 5, a transistor gate electrode is formed simultaneously with polysilicon electrode 6. Diffusion area 7 of contact is formed at the same time that source/drain regions for an N-channel MOS transistor are ion-implanted. Subsequently, interlayer dielectric film 9 and metallic interconnect lines 10 and 11 are formed by means of a usual metallization process. A heat treatment process is added to the metallization process when planarizing interlayer dielectric film 9.

In the present embodiment, the heat treatment process is performed at 850 degrees centigrade for 90 minutes in total. Owing to this heat treatment process, impurity ions, implanted into silicon substrate 1, are diffused to form areas 4 and 7. The impurity concentration increases with the depth and peaks at a depth of about 0.15 μm (about $1 \times 10^{19} \text{cm}^{-3}$), which is indicated by the solid line of FIG. 6. In other words, the FIG. 2 impurity concentration profile is formed, and a MOS capacitor having a structure of FIG. 1 can be fabricated easily.

A preferred way of performing an impurity implantation is described below.

Figure 14:
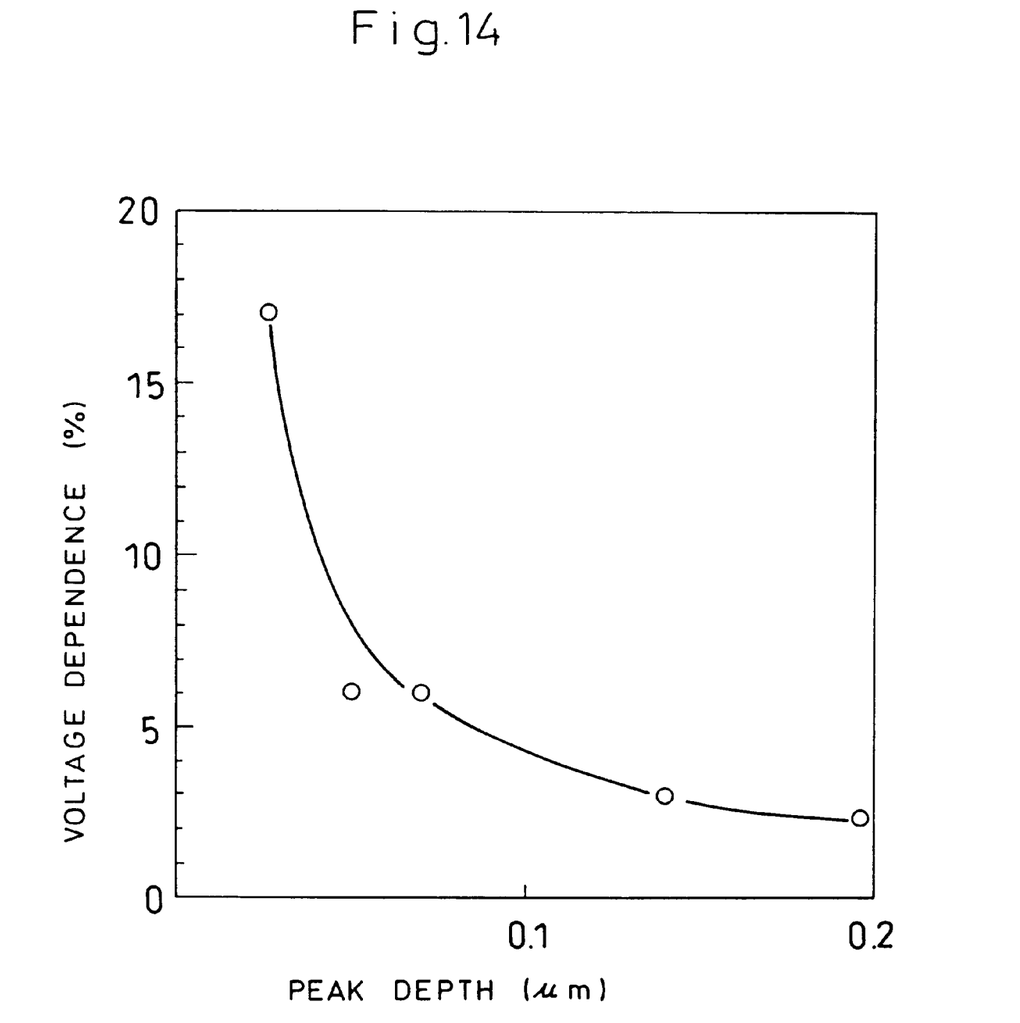
FIG. 14 is a graph in which the impurity concentration peak depth versus the voltage dependence in a MOS capacitor n-type diffusion area is shown.

The impurity concentration peak point is first explained. The impurity concentration peak depth after formation of a MOS capacitor versus the voltage dependence is illustrated in FIG. 14. As can be observed from FIG. 14, it is appreciated that an impurity profile where the impurity concentration increases up to a depth of 0.05 μm is able to control the dependence of the capacitance on the voltage.

In the present embodiment, ions of phosphorus are implanted into n-type impurity diffusion area 4, which however is not to be considered restrictive. However, implantation with ions of phosphorus provides the advantages that, since the phosphorus atoms have a great diffusion coefficient, it is easy to widen a difference between a surface concentration immediately after the implantation and a surface concentration after a MOS capacitor is formed.

Figure 7:
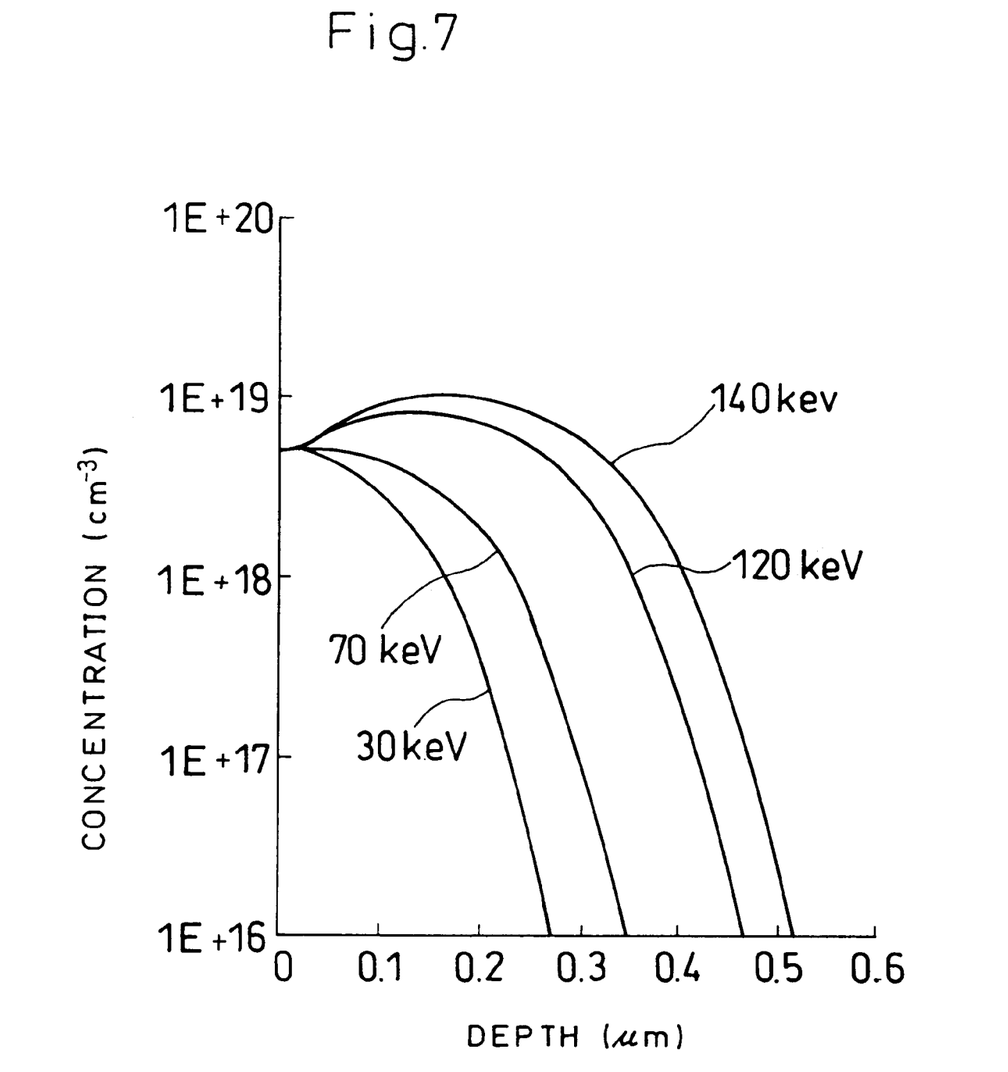
FIG. 7 is a graph showing an impurity profile formed when ions of phosphorus are used as a dopant in the first embodiment.

In the present embodiment, an implantation process is performed at an implantation energy of 120 keV, which is however not to be considered restrictive. An implantation energy of 70 keV or more may be used. FIG. 7 shows an impurity concentration profile formed when phosphorus is used as a dopant. Referring to FIG. 7, the implantation energy, i.e., a parameter, is set such that the surface concentration after interconnect lines are formed becomes uniform. An impurity concentration profile where the concentration increases with the depth is formed by setting an implantation energy above 70 keV.

Figure 8:
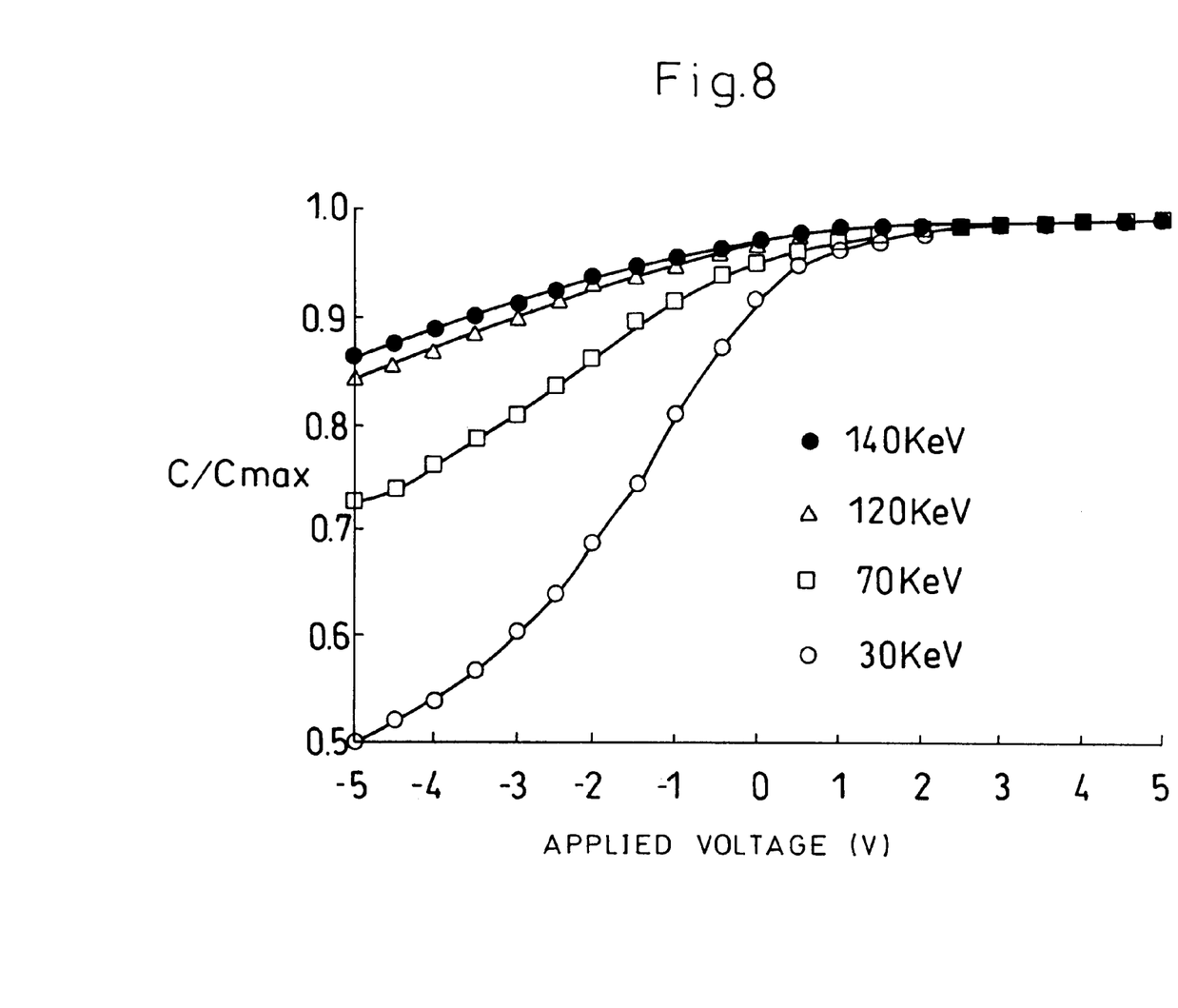
FIG. 8 shows the dependence of a MOS capacitor of the first embodiment upon the voltage.

Referring now to FIG. 8, the dependence of the MOS capacitor capacitance upon the voltage is shown wherein the implantation energy is a parameter. As can be seen from FIG. 8, an implantation energy of 70 keV or more provides the advantage that the dependence of the capacitance on the voltage can be controlled to a further extent.

For the same reason as applied to phosphorus, where atoms of arsenic are implanted into n-type impurity diffusion area 4, an implantation energy of 140 keV or more is preferable.

EMBODIMENT 2

A method of fabricating a MOS capacitor of a second embodiment of this invention is described by making reference to FIGS. 9–12.

A structure including MOSFET of the second embodiment is basically identical with the one as shown in FIG. 1 and, hence, only a MOS capacitor section is illustrated.

Figure 9:
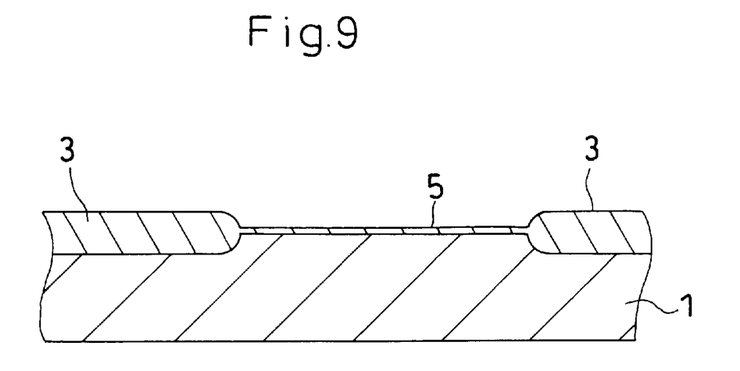
FIGS. 9–12 depict cross-sectional views of a thermal oxidization step, a step of forming an impurity diffusion area of contact, a step of forming an n-type diffusion area by means of a through-implantation process, and a metallization step of the fabrication of a MOS capacitor in accordance with a second embodiment of the present invention.
Figure 10:
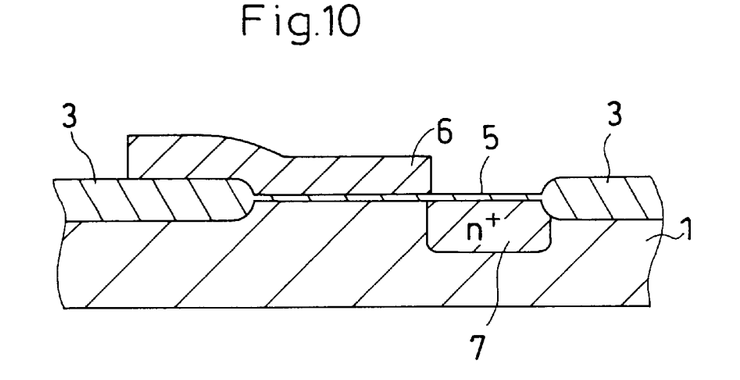
Figure 11:
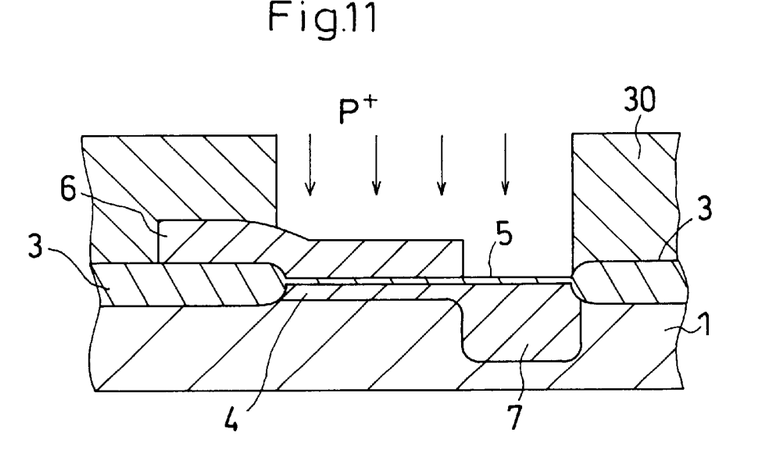
Figure 12:
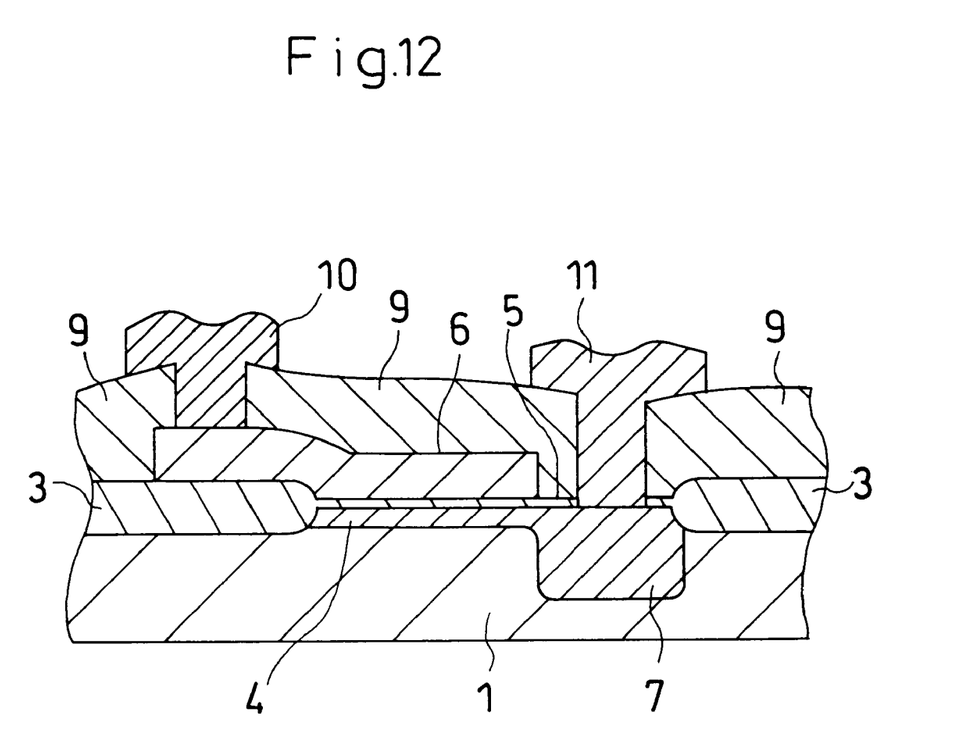

As shown in FIG. 9, isolator 3 is formed on p-type silicon substrate 1, before performing a thermal oxidation process to form silicon oxide layer 5. This thermal oxidation process is a usual thermal oxidation process used to form a gate oxide for a conventional MOS transistor, so that the control of film thickness can be accomplished at a high accuracy. The reliability of oxide layers is high. Thereafter, as shown in FIG. 10, a transistor gate electrode is formed simultaneously with polysilicon electrode 6. Diffusion area 7 is formed at the same time that source/drain regions for an n-channel MOS transistor are formed by means of an ion implantation process. Thereafter, as shown in FIG. 11, resist 30 is selectively exposed to define an impurity diffusion area. Thereafter, an impurity (P+) for controlling the threshold voltage of transistors of a depression type is implanted into the defined diffusion area through polysilicon electrode 6, to form n-type diffusion area 4. Such a through ion implantation process is performed at an implantation energy of 200 keV at a dose of $4\times10^{14} cm^{-2}$. This is followed by the formation of interlayer dielectric film 9 and metallic interconnect lines 10 and 11 by means of a usual metallization process (see FIG. 12).

In the second embodiment, an implantation of ions of phosphorus (P+) is carried out after silicon oxide layer 5 is formed. This provides the advantage that an arbitrary impurity profile can be formed while lessening the effects of the following heat treatment process.

In the second embodiment, after source/drain regions and polysilicon electrode 6 are formed, diffusion area 4 is ion-implanted. However, such an ion implantation may be performed any time after silicon oxide layer 5 is formed.

In the second embodiment, ions of phosphorus are implanted into n-type diffusion area 4 because phosphorus produces less damage to silicon oxide layer 5 in comparison with other impurity ions. Accordingly, use of ions of phosphorus is preferable, but other impurities such as arsenic may be used.

In each of the first and second embodiments of this invention, a p-type silicon substrate is used as a silicon substrate for a MOS capacitor. An n-type well or a p-type well may be used with the same effect.

In each of the first and second embodiments of this invention, a MOS capacitor in which an n-type diffusion area acts as a bottom electrode is employed. A MOS capacitor in which a p-type diffusion area acts as a bottom electrode may be used with the same effect.

In each of the first and second embodiments of this invention, polysilicon is used to form a gate electrode. Other materials of low resistivity such as polycide may be used to form a gate electrode.

In each of the first and second embodiments of this invention, a thermal oxidation process is used to form a silicon oxide layer. A CVD oxide layer or a laminated layer may be used with the same effect.

The invention claimed is:

1. A metal-oxide-semiconductor (MOS) capacitor comprising:

(a) a semiconductor substrate;

(b) a diffusion area formed by implanting an impurity of high concentration into a region of said semiconductor substrate, said diffusion area being a bottom electrode;

(c) a diffusion area of contact formed so as to extend from the surface of said semiconductor substrate toward the inside of said semiconductor substrate and to have a greater diffusion depth than that of said diffusion area, said diffusion area of contact having a higher impurity concentration than that of said diffusion area and being connected to said diffusion area over an overall sideface of said diffusion area;

(d) a capacitance insulating layer formed on said diffusion area; and (e) a conducting layer formed on said capacitance insulating layer, said conductive layer being a top electrode;

wherein an impurity profile is formed in said diffusion area such that the concentration gradient of said impurity increases from a surface common to said diffusion area and said capacitance insulating layer towards the inside of said semiconductor substrate, and wherein the impurity profile has a maximum concentration at a predetermined depth.

2. A MOS capacitor according to claim 1 wherein a MOS transistor is formed in said semiconductor substrate.

3. A MOS capacitor according to claim 1, wherein the concentration of said impurity increases at least up to a depth of 0.05 $\mu$m from said surface.

4. A MOS capacitor according to claim 1 wherein said impurity is phosphorus.

5. A MOS capacitor according to claim 1 wherein said conducting layer is formed of polysilicon.

6. A MOS capacitor according to claim 1 wherein the film thickness of said capacitance insulating layer is less than or equal to a thickness which exhibits the same capacitance per unit area that a 20 nm-thick silicon oxide layer exhibits.

7. A MOS capacitor according to claim 1 wherein at least a region of said capacitance insulating layer is in contact with said semiconductor substrate and is formed of silicon oxide.

8. A MOS capacitor according to claim 1 wherein the concentration of said impurity at said surface common to said diffusion area and said capacitance insulating layer is less than or equal to $1\times10^{20} cm^{-3}$.

* * * * *